METHOD OF FORMING A WINDOW IN A PASSIVATING LAYER OF A SEMICONDUCTOR

Filed March 3, 1969

INVENTOR.
DAVID M. RANDALL
AND
ROBERT C. HENNE
BY Pearce & Schaeperklaus
Attorneys United States Patent Office 3,489,658
Patented Jan. 13, 1970

3,489,658 METHOD OF FORMING A WINDOW IN A PASSIVATING LAYER OF A SEMICONDUCTOR

David M. Randall, Cincinnati, Ohio, and Robert C. Henne, Ballwin, Mo., assignors to Avco Corporation, Cincinnati, Ohio, a corporation of Delaware Filed Mar. 3, 1969, Ser. No. 803,640
Int. Cl. B01j *1/12;* H01l *7/50*
U.S. Cl. 204—38 6 Claims

ABSTRACT OF THE DISCLOSURE

In the making of a semiconductor body having a dielectric passivating layer, a window is formed in the layer by applying to the semiconductor body a pad of a resinous film material, overlaying the pad and surrounding portions of the body with the dielectric layer, and subjecting the body to ultrasonic vibration to cause breakup of the dielectric layer overlying the pad, and removing the pad to provide an opening through the dielectric layer through which a portion of the body is exposed.

This invention relates to semiconductor electronic devices such as diodes, transistors and the like. More particularly, this invention relates to a method of forming an opening or window in a passivating film or layer overlying such a semiconductor electronic device to reveal a portion thereof.

In many electronic devices made from semiconducting materials it is necessary to neutralize surface conductor paths or protect surfaces with a thin dielectric layer. An object of this invention is to provide a method of removing a section of the thin dielectric passivating layer to provide a window therethrough without injuring the substrate which is exposed.

In the past, windows in such passivating layers have been formed by etching procedures which can injure the substrate. A further object of this invention is to provide a method of forming a window in such a passivating layer without etching thereof.

Briefly, our method includes the steps of applying to the area of the substrate over which a window is to be formed a layer of a resinous material. The resinous material can be a photosensitive resinous material which can originally cover a greater portion of the substrate and is exposed and developed to leave only a pad of the resinous material at the location where the window is to be formed. A dielectric passivating layer is applied overlying the pad and other portions of the substrate. The semiconductor body with the passivating layer thereon is immersed in a liquid bath and the bath is subjected to ultrasonic vibration which causes breakup of the passivating layer over the resinous pad. The liquid can be a solvent for the resin of the pad so that, as the passivating layer breaks up over the pad, the pad is dissolved to reveal the substrate. An electrical conductor can be attached to the substrate at the window in the passivating layer to provide an electrical connection thereto.

The above and other objects and features of the invention will be apparent to those skilled in the art to which this invention pertains from the following detailed description and the drawing, in which.

In the following detailed description and the drawing, like reference characters indicate like parts.

Figure 1:
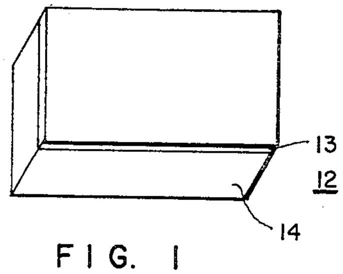
FIG. 1 is a perspective view showing a typical semiconductor body before the formation of a mesa thereon.

In the drawing, the method of the invention is illustrated with reference to the preparing of an electrical contact for an indium-antimony infra-red detector of the type described in the co-pending application of Norman J. Gri and Eugene T. Yon, Ser. No. 723,994, filed Apr. 25, 1968 for "Improved Indium Antimonide Infrared Detector Contact and Process for Making Same," said patent application and invention being assigned to the same assignee, namely, Avco Corporation, as the present application and invention.

Figure 2:
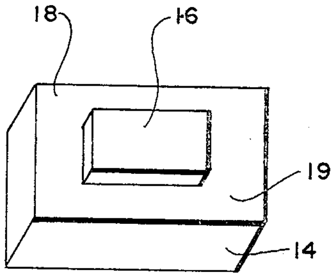
FIG. 2 is a perspective view of the semiconductor body with a mesa formed thereon.

In FIG. 1 is shown an indium antimonide body 12 having an upper layer 13 formed by solid state diffusion of an electron acceptor element such as cadmium or zinc. The lower or base portion 14 of the body 12 can include a small proportion of an electron donor element such as tellurium. Excess portions of the upper layer 13 are removed by etching to leave a plateau or mesa 16 as shown in FIG. 2, portions of the upper layer being removed as indicated at 18 and 19 in FIG. 2. The manufacture of the structure shown in FIG. 2 and described hereinabove can follow the teaching of the aforementioned co-pending application Ser. No. 723,994.

Figure 3:
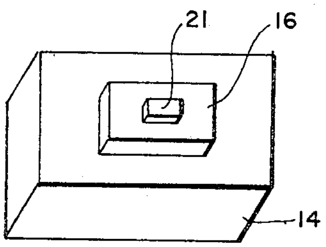
FIG. 3 is a perspective view of the semiconductor body with a resin pad attached to the mesa thereof.

On the mesa 16 is mounted a resin pad 21 (FIG. 3) which can be formed from a photosensitive resist material. Initially, the pad 21 can be a portion of a larger film which can be applied to the mesa 16 and surrounding sections of the base portion 14 of the semiconductor body. Excess portions of the film can be exposed to light and can be removed by developing in the usual manner to leave the pad 21 overlying a portion of the mesa 16 as shown in FIG. 3.

Figure 5:
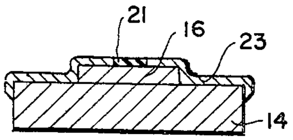
FIG. 5 is a view in lengthwise section of the semiconductor body following exposure thereof to ultrasonic vibration to remove the portion of the passivating layer overlying the resin pad.
Figure 6:
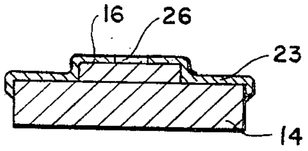
FIG. 6 is a view in lengthwise section of the semiconductor body following removal of the resin pad to provide a window through the passivating layer overlying the mesa.
Figure 4:
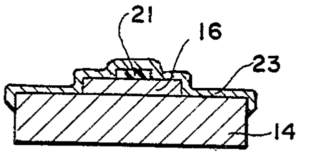
FIG. 4 is a view in lengthwise section of the body with a passivating layer overlying the resin pad, the mesa, and the body thereof.
Figure 7:
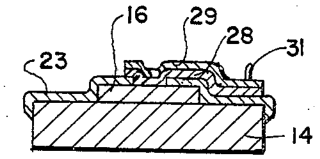
FIG. 7 is a view in lengthwise section of the semiconductor body with a conductor reaching the mesa through the window.

The upper surface of the mesa 16 and the lower body portion 14 are covered with a thin dielectric layer 23 (FIG. 4) of a passivating material. Surface passivation is required at the area where there is a junction between the material of the mesa 16 and that of the body base portion 14. The passivating material can include a first stratum of an anodized surface. The oxidizing can be carried out in a conventional manner using a solution of potassium hydroxide or other suitable solution containing the OH radical as the electrolyte to give a film thickness of oxide of approximately 1000 A. A second or outer stratum having a thickness of approximately 6000 A. of a durable dielectric passivating material such as silicon monoxide or silicon dioxide is applied to the first stratum by evaporation or by radio frequency sputtering or electron beam deposition according to known techniques. The body is then immersed in a liquid bath subjected to ultrasonic agitation. For this purpose, a commercial ultrasonic bath can be used. The liquid can be a solvent for the resin of the pad 21, for example, trichloroethylene. Since the bond between the passivating layer and the substrate is stronger than the bonds between the resin on the one hand and the substrate and the passivating layer on the other, the ultrasonic energy breaks up the layer of passivating material overlying the pad so that the pad is uncovered as shown in FIG. 5 to be dissolved by the solvent of the bath to provide a window 26 (FIG. 6) in the passivating layer 23 overlying a portion of the mesa 16 to reveal a portion of the upper face of the mesa. The window 26 provides an opening in the passivating layer through which an electrical connection can be made with the material of the mesa. The electrical contact can be provided by a two-step technique of the type described in the aforementioned application of Gri and Yon, Ser. No. 723,994. The body can be heated to an elevated temperature of about 180 degrees C. and a thin layer of chromium 28, for example 100 A. is deposited by vacuum evaporation on the substrate to form a contact and to provide adherence to the dielectric surface. Then a deposit of gold 29 is evaporated onto the chromium layer, both the chromium and gold being applied through a mask of appropriate dimensions. A gold wire 31 can be attached to the gold layer, preferably by ultrasonic techniques.

The invention has been described with reference to the forming of a window in passivating material of an indium-antimony infrared detector, but the method can be used for forming windows in passivating layers and the like in other semiconductor devices and various changes can be made without departing from the spirit and scope of the invention as defined in the appended claims.

Having described our invention, what we claim as new and desire to secure by Letters Patent is:

1. The method of forming a semiconductor body having a dielectric layer provided with a window therein which comprises applying to the semiconductor body a pad of a resinous film material, overlaying the pad and surrounding portions of the body with a dielectric layer, and subjecting the body to ultrasonic vibration of sufficient intensity to cause breakup of the dielectric layer overlaying the pad, and removing the pad to provide an opening through the dielectric layer through which a portion of the body is exposed.

2. A method as in claim 1 wherein the body is subjected to ultrasonic vibration in a bath of a solvent for the material of the pad, whereby the pad is dissolved as the pad is exposed.

3. A method as in claim 1 wherein the pad is applied to the body as a portion of a film of photosensitive resinous material and portions of the photosensitive resinous material surrounding the pad are exposed and removed by developing the photosensitive resinous material.

4. A method as in claim 1 wherein an electrical conductor is attached to the body at the window.

5. A method as in claim 1 wherein the dielectric layer includes a stratum of an oxide of silicon.

6. A method as in claim 1 wherein the dielectric layer includes a first stratum of an anodized surface oxide and a second stratum of an oxide of silicon.

References Cited

UNITED STATES PATENTS

| | | | |
|---|---|---|---|
| 3,411,999 | 11/1968 | Weinberg | 204—141 |
| 3,330,026 | 7/1967 | Best et al. | 29—470.1 |
| 3,088,888 | 5/1963 | Leff | 204—143 |

JOHN H. MACK, Primary Examiner

R. L. ANDREWS, Assistant Examiner

U.S. Cl. X.R.

29—584, 590; 204—56, 143